US006429477B1

(12) United States Patent
Mandelman et al.

(10) Patent No.: US 6,429,477 B1
(45) Date of Patent: Aug. 6, 2002

(54) SHARED BODY AND DIFFUSION CONTACT STRUCTURE AND METHOD FOR FABRICATING SAME

(75) Inventors: Jack A. Mandelman, Stormville; Rama Divakaruni, Somers, both of NY (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/702,315

(22) Filed: Oct. 31, 2000

(51) Int. Cl.[7] .................. H01L 29/76; H01L 29/94; H01L 31/113; H01L 31/119; H01L 31/108; H01L 27/01; H01L 27/12; H01L 31/062; H01L 31/0392

(52) U.S. Cl. .................. 257/301; 257/347; 257/374

(58) Field of Search .................. 257/329–350, 257/374–382, 301–302; 438/238–253, 151–155

(56) References Cited

U.S. PATENT DOCUMENTS

| 5,185,280 A | 2/1993 | Houston et al. |
| 5,729,039 A | 3/1998 | Beyer et al. |
| 5,818,085 A | 10/1998 | Hsu et al. |
| 5,929,490 A | 7/1999 | Onishi |
| 5,930,605 A | 7/1999 | Mistry et al. |
| 6,306,691 B1 * | 10/2001 | Koh .................. 438/149 |
| 6,352,882 B1 * | 3/2002 | Assaderaghi et al. ........ 438/155 |
| 6,358,785 B1 * | 3/2002 | Masuda .................. 438/149 |

* cited by examiner

Primary Examiner—Tom Thomas
Assistant Examiner—Cuong Quang Nguyen
(74) Attorney, Agent, or Firm—Schmeiser, Olsen & Watts

(57) ABSTRACT

The preferred embodiment overcomes the difficulties found in the background art by providing a body contact and diffusion contact formed in a single shared via for silicon on insulator (SOI) technologies. By forming the body contact and diffusion contact in a single shared via, device size is minimized and performance is improved. Particularly, the formed body contact connects the SOI layer with the underlying substrate to avoid instabilities and leakage resulting from a floating SOI channel region. The formed diffusion contact connects device diffusions to above wiring to facilitate device operation. By providing the body contact and diffusion contact together in a single shared via, the preferred embodiment avoids the area penalty that would result from separate contacts. Additionally, the preferred embodiment provides a body contact that is self aligned with other devices, minimizing tolerances needed while minimizing process complexity. Additionally, the shared via body contact and diffusion contact can be selectively formed borderless to adjacent gate conductors in the device.

10 Claims, 11 Drawing Sheets

SHARED BODY AND DIFFUSION CONTACT STRUCTURE AND METHOD FOR FABRICATING SAME

BACKGROUND OF THE INVENTION

1. Technical Field

This invention relates, in general, to the design and production of semiconductor microchips. More particularly, this invention relates to methods for electrically connecting the various components of a semiconductor microchip.

2. Background Art

The advent of the microchip has revolutionized life in the latter half of the 20th century. Microchips are a ubiquitous part of life, being found in everything from computers to garage door openers. Over the years, the microelectronics industry has diligently sought to further reduce the size of the microelectronics built on silicon chips.

One of the major factors in determining the degree of miniaturization possible on a chip is the amount and type of connections required between the electrical devices contained on the chip. For example, contact needs to be made between devices such as transistors, and wiring levels above the transistors. This has typically been accomplished through the formation of "vertical interconnects" (commonly called studs) that are formed to connect the underlying device with the overlying wiring. For example, using a "damascene" process "troughs" and "vias" are etched in the silicon dioxide between circuit devices. The entire surface of the chip is then covered with copper or aluminum. Next, the copper is planarized, removing it from the chip's surface and leaving copper only in the troughs and vias. The remaining copper in the troughs forms the "wires" that provide intralevel connection while the copper in the vias forms the vertical interconnect studs that provide interlevel connection.

In recent years, a new type of semiconductor processing has become important. This process, called silicon-on-insulator, or SOI, uses a buried insulator layer formed in the wafer. Devices such as transistors are then formed in the silicon layer above insulator. SOI wafer structures provide many advantages, particularly for high performance, low-voltage devices. For example, advantages of SOI include improved performance at low voltages resulting from reduced junction capacitances, and dynamic threshold voltages effects, and reduced soft-error upset rate due to decreased silicon collection volume On issue in SOI processing is the need for selective body contacts between the SOI layer, the layer of silicon formed on the insulator, and the substrate layer formed beneath the insulator layer. For example, in some applications body contacts are needed to provide a conduction path for rapid equilibration of body charge. In this case, the body contact helps avoid instabilities that can result from transient operations. This use of body contacts are particularly important in those application that require closely matched electrical characteristics of adjacent devices, such as cross-coupled pairs in sense amps, SRAM cells, current mirrors, etc.

Accordingly, the need exists for vertical interconnects and body contacts that provide necessary connections in SOI devices while minimizing the space and processing complexity required for these contacts.

DISCLOSURE OF INVENTION

The present invention overcomes the difficulties found in the background art by providing a body contact and diffusion contact formed in a single shared via for silicon on insulator (SOI) technologies. By forming the body contact and diffusion contact in a single shared via, device size is minimized and performance is improved. Particularly, the formed body contact connects the SOI layer with the underlying substrate to avoid instabilities and leakage resulting from a floating SOI channel region. The formed diffusion contact connects device diffusions to above wiring to facilitate device operation. By providing the body contact and diffusion contact together in a single shared via, the preferred embodiment avoids the area penalty that would result from separate contacts. Additionally, the preferred embodiment provides a body contact that is self aligned with other devices, minimizing tolerances needed while minimizing process complexity. Additionally, the shared via body contact and diffusion contact can be selectively formed borderless to adjacent gate conductors in the device.

BEST MODE FOR CARRYING OUT THE INVENTION

The present invention overcomes the difficulties found in the background art by providing a body contact and diffusion contact formed in a single shared via for silicon on insulator (SOI) technologies. By forming the body contact and diffusion contact in a single shared via, device size is minimized and performance is improved. Particularly, the formed body contact connects the SOI layer with the underlying substrate to avoid dynamic charge leakage. The formed diffusion contact connects device diffusions to above wiring to facilitate device operation. By providing the body contact and diffusion contact together in a single shared via, the preferred embodiment avoids the area penalty that would result from separate contacts. Additionally, the preferred embodiment provides a body contact that is self aligned with other devices, minimizing tolerances needed while minimizing process complexity.

Figure 1:
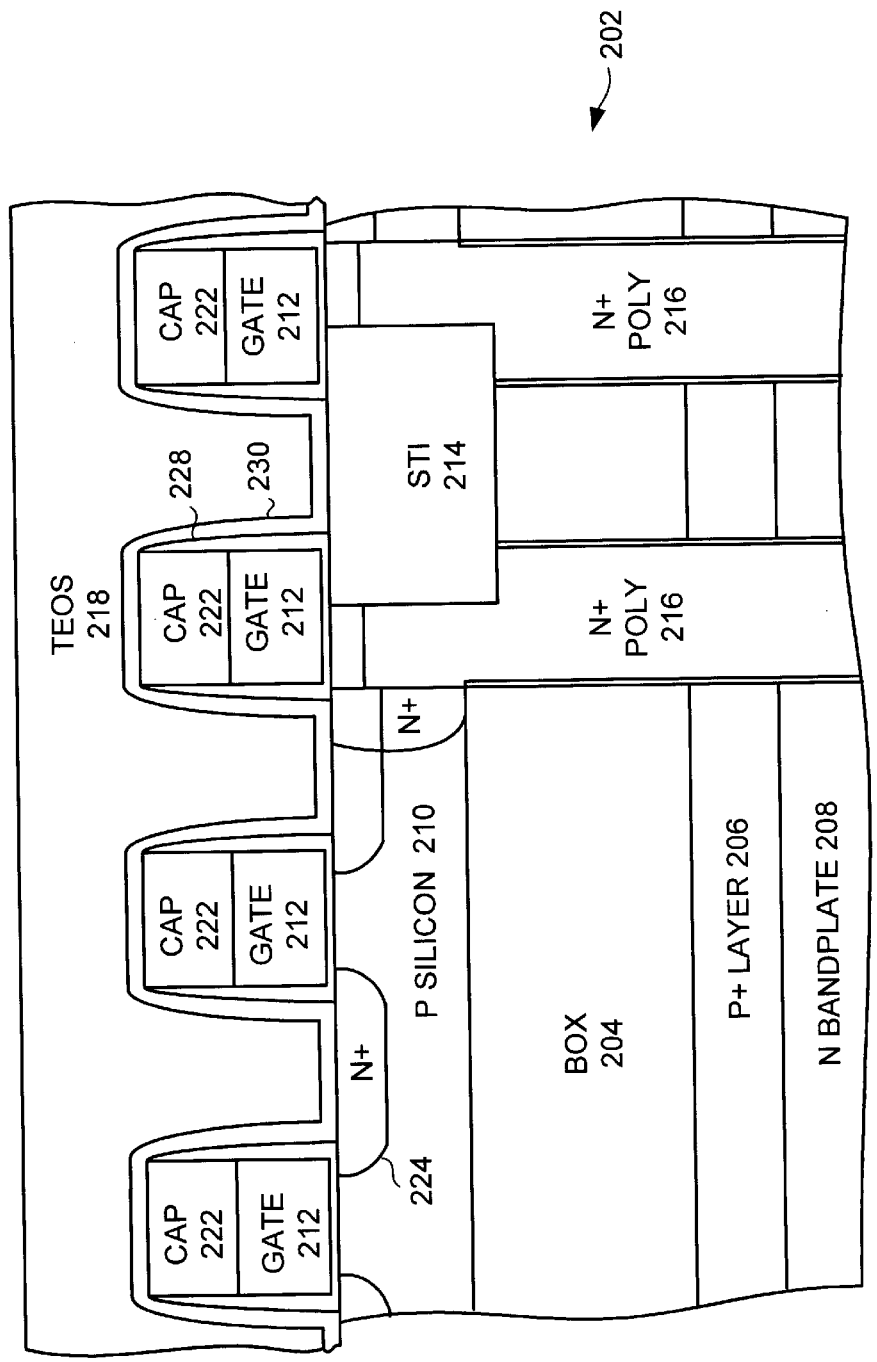
FIGS. 1–6 are cross-sectional views of semiconductor in the process of forming shared via contacts in accordance with the preferred embodiment.

Referring now to FIG. 1, an exemplary substrate 202 is shown that will be used to illustrate the formation of a dynamic random access memory device (DRAM) that uses the preferred shared via contacts. Of course, the shared via contacts of the preferred embodiment are not limited to DRAM devices and can thus be applied selectively to other devices which use circuits that may encounter instabilities and leakage due to floating body effects. Examples of such circuits include, but are not limited to, single device cells, pass gates, cross-coupled latches, I/O circuitry, etc. Those skilled in the art will recognize that many of the steps described below are specific to the DRAM example, and that the preferred embodiment shared via contacts can be applied to other devices without the use of those DRAM specific steps.

In accordance with the preferred embodiment of the present invention, the substrate 200 is a silicon on insulator (SOI) substrate. As such, it includes a buried insulator layer, labeled BOX 204. On top of BOX 204 is formed a silicon layer 210, which comprises the SOI layer. SOI substrates can be formed using many known techniques. For example, one acceptable technique for creating a silicon on insulator substrate is described in U.S. Pat. No. 4,676,841, entitled "Fabrication of dielectrically isolated devices utilizing buried oxygen implant and subsequent heat treatment at temperatures above 1300° C.". According to the preferred embodiment of the present invention the "buried oxide" method is used. To prepare a buried oxide substrate, $O^+$ is implanted into a silicon substrate at elevated temperatures (typically between 500° C. and 700° C.). The $O^+$ is implanted at a dose and energy sufficient to locate the peak of the implant at a desired distance beneath the surface of the silicon substrate. Those skilled in the art are knowledgeable as to how to adjust both $O^+$ dosage and energy based upon the requirements of a particular application. After. the $O^+$ has been implanted, the substrate is annealed in an oxidizing ambient at a sufficient temperature (typically greater than 1300° C.)and for a sufficient time to return the top silicon to its crystalline form and to form a buried layer of silicon dioxide. Of course, this is just one example of the many ways that can be used to form a SOI wafer, and that other methods and other dielectrics are equally applicable. For example, methods such as SMARTCUT, silicon direct wafer bonding or epitaxial silicon on sapphire, may be used.

In the preferred embodiment, the insulator used to form BOX 204 is preferably silicon dioxide, but one skilled in the art will realize that other insulators are available for this use, and that the present invention is applicable no matter what type of insulator, substrate, and/or methods are used to form the SOI substrate 204. In the following example, the SOI is formed on a P-substrate. However, the invention could also be implemented on a SOI formed on a N substrate with a P-epitaxial layer.

With an appropriate SOI wafer formed, further processing proceeds as follows. Deep trench capacitors are formed, including the formation of a buried plate counter electrode by out diffusion of suitable dopant, formation of capacitor dielectric and the deposition of N+ poly 216 which serves as the storage electrode material. An N bandplate 208 is then formed to connect the various capacitor counter electrodes, preferably leaving room for a layer between the N bandplate and the BOX 204 layer. The next step is to form a buried P+ layer 206 between the N bandplate and BOX 204 layer, preferably by implanting a suitable dopant. As will become clear later, the buried P+ layer 206 serves as connection means for establishing the potential of the overlying SOI channel regions.

The next part of this step is to form isolation regions. In the preferred embodiment, the isolation regions comprises shallow trench isolation (STI). The STI is preferably formed over the wafer in all areas except where the devices are formed, which are generally called the "active areas". Thus, the formation of the STI also defines the active areas on the wafer. STI is suitably formed by etching isolation trenches to the top of the buried oxide, filling the isolation trenches by depositing a suitable dielectric (such as CVD oxide) and planarizing by chemical mechanical polish.

With the STI formed, well and channel tailor implants are made where devices are to be formed. These are done to provide the appropriate channel doping and to adjust the threshold voltage of the FET device to be built. This step is generally performed at least twice, once for n-channel devices and again for p-channel devices using appropriate photoresist as implant blocking masks.

The next part of this step is to form the material for the gate stack on the wafer. The first layer of the gate stack is a gate dielectric, such as silicon dioxide which can be grown on the silicon. This is typically referred to as gate oxide. The next layer of the gate is preferably a conductor such as polysilicon, which is deposited over the gate oxide. To form conductive polysilicon, intrinsic polysilicon is deposited and later, typically during source/drain implanting, doped either n+or p+type to make it conductive. Additionally, the conductive portion of the gate stack can include a layer of lower resistivity material covering the polysilicon, such as $WSi_x$, $CoSi_x$, or a refractory metal such as tungsten. The final layer of the gate stack is the gate cap material. Gate cap material is deposited over the gate conductor. The gate cap can comprise any suitable material, such as silicon nitride.

The next part of this step is to pattern the gate stack to define the various gates on the devices. Preferably this is done using any of the many etching process known in the art to pattern the gate stack. This results in the separate gate stacks illustrated in FIG. 1, with each gate stack including a gate cap 222 and a gate conductor 212 and an underlying gate oxide.

The next step is to create sidewall spacers on the sidewalls of the gate stacks. These can be formed by any method, such as a conformnal deposition of dielectric material followed by a directional etch. In the preferred embodiment silicon nitride is deposited and directional etched to form sidewall spacers 228 on the sidewalls of each of the pattered gate stacks.

The next step is to create the source and drain diffusions of the devices. This process is well know in the art and consists of using the gate stack and sidewall spacers as masks while bombarding the silicon substrate with the appropriate dopants. The substrate is then heated to activate the implanted dopants. This results in the creation of source and drain diffusion regions on either side of the gates in the active areas, including N+ diffusion 224. The remaining lightly doped SOI beneath the gate oxide serves as a channel region. This step is typically performed at least twice, once for n-channel devices and again for p-channel devices using appropriately patterned photoresist as implant blocking masks. It should be noted that in some cases, depending on the desired source/drain profile, the source and drain diffusions can be formed before the formation of the sidewall spacers.

With the diffusions formed, the next step is to form a etch stop liner 230. The etch stop liner 230 preferably comprises a composite of silicon dioxide and silicon nitride, with the silicon dioxide formed first and the silicon nitride formed on the silicon oxide. The two composite layers in etch stop liner 230 will serves as etch stop during the opening of vias and in later processing.

The next step is to deposit a layer of tetraethyl orthosilicate formed CVD oxide (TEOS) or other suitable wiring insulator layer and planarize the top surface of the TEOS. This results in TEOS 218 covering the wafer and devices. The TEOS layer 218 provides the substrate in which the device wiring will be formed.

The steps described above result in the formation of devices as illustrated in FIG. 1. Again, the preferred embodiment shared via contacts can be used in many different SOI applications, many of which would use processing steps different than described above. It will now be described how shared via contacts can be formed for the devices illustrated in FIG. 1. Again, the preferred embodiment provides a body contact and diffusion contact formed in a single shared via for SOI devices, with the body contact connecting the SOI layer with a buried conductor layer in the underlying substrate, and the diffusion contact connecting the diffusions to above wiring. By providing the body contact and diffusion contact together in a single shared via, the preferred embodiment avoids the area penalty that would result from separate contacts.

Figure 2:
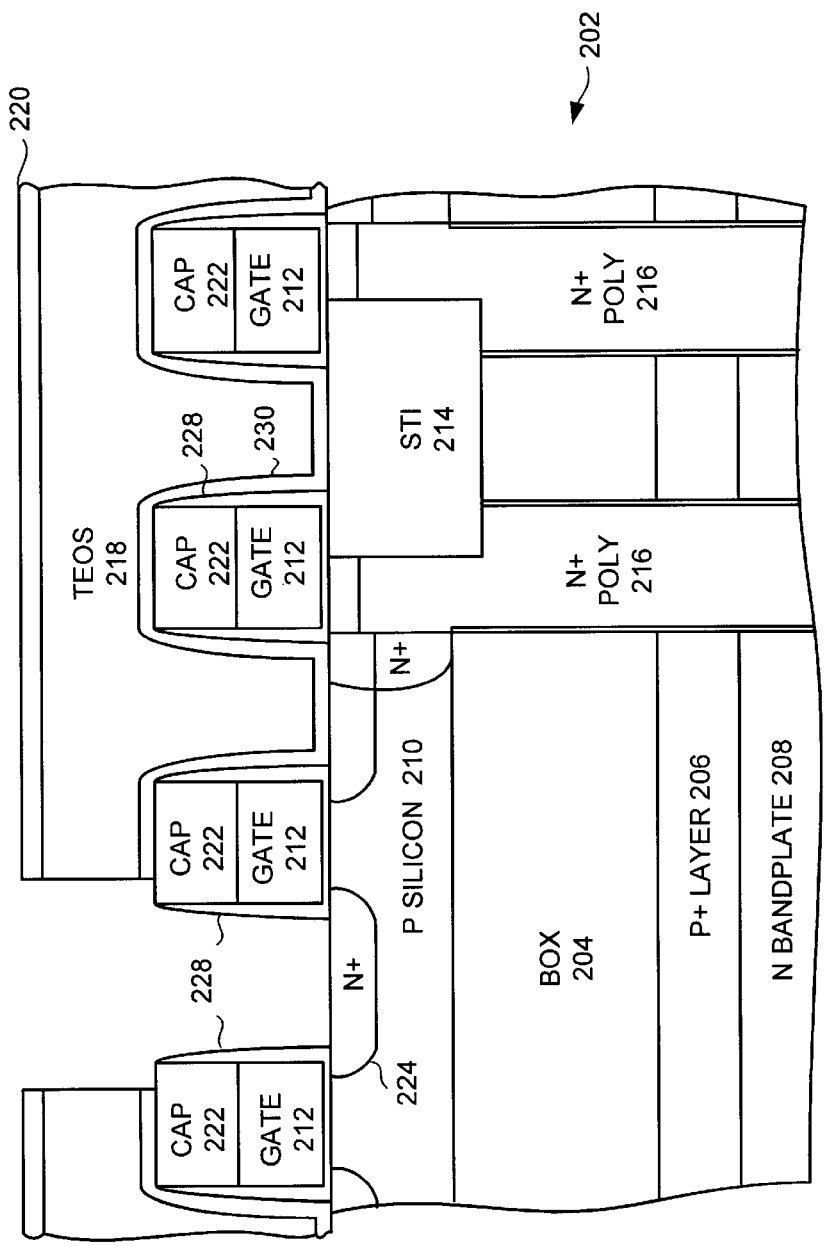

Turning now to FIG. 2, the first step in the process of forming the shared via contacts is to open a via in the TEOS layer. This is preferably done by depositing a mask layer, patterning the mask layer, and then using the patterned mask to open a via in the TEOS layer. In the preferred embodiment, a layer of silicon nitride is then deposited on the TEOS layer. The layer of silicon nitride is then patterned using any suitable process. The a via can then be opened (using RIE) in the underlying TEOS layer, using the patterned silicon nitride, the nitride gate caps, and the etch stop liner as a hard mask.

In FIG. 2, the silicon nitride layer 220 has been deposited and patterned. The patterned nitride layer 220, the caps 222 and nitride portion of etch stop liner 230 are used as a hard mask while the via in TEOS 218 is opened. In the preferred embodiment, a subsequent etch is used to form the via in TEOS 218, and is thus selective to the nitride in the layer 220, caps 222 and etch stop liner 230. Thus, the etch stops at these layers.

Following the formation of the via in TEOS 218, a nitride etch is used to remove the nitride portion of etch stop liner 230 exposed during formation of the via. The oxide portion of the etch stop liner 230 (not shown) serves as an etch stop during removal of the exposed etch stop liner 230. Following the removal of the exposed etch stop liner 230, the exposed underlying oxide layer is removed with an etch selective to the nitride. This removes the exposed oxide layer while stopping on the underlying sidewall spacers.

Figure 3:
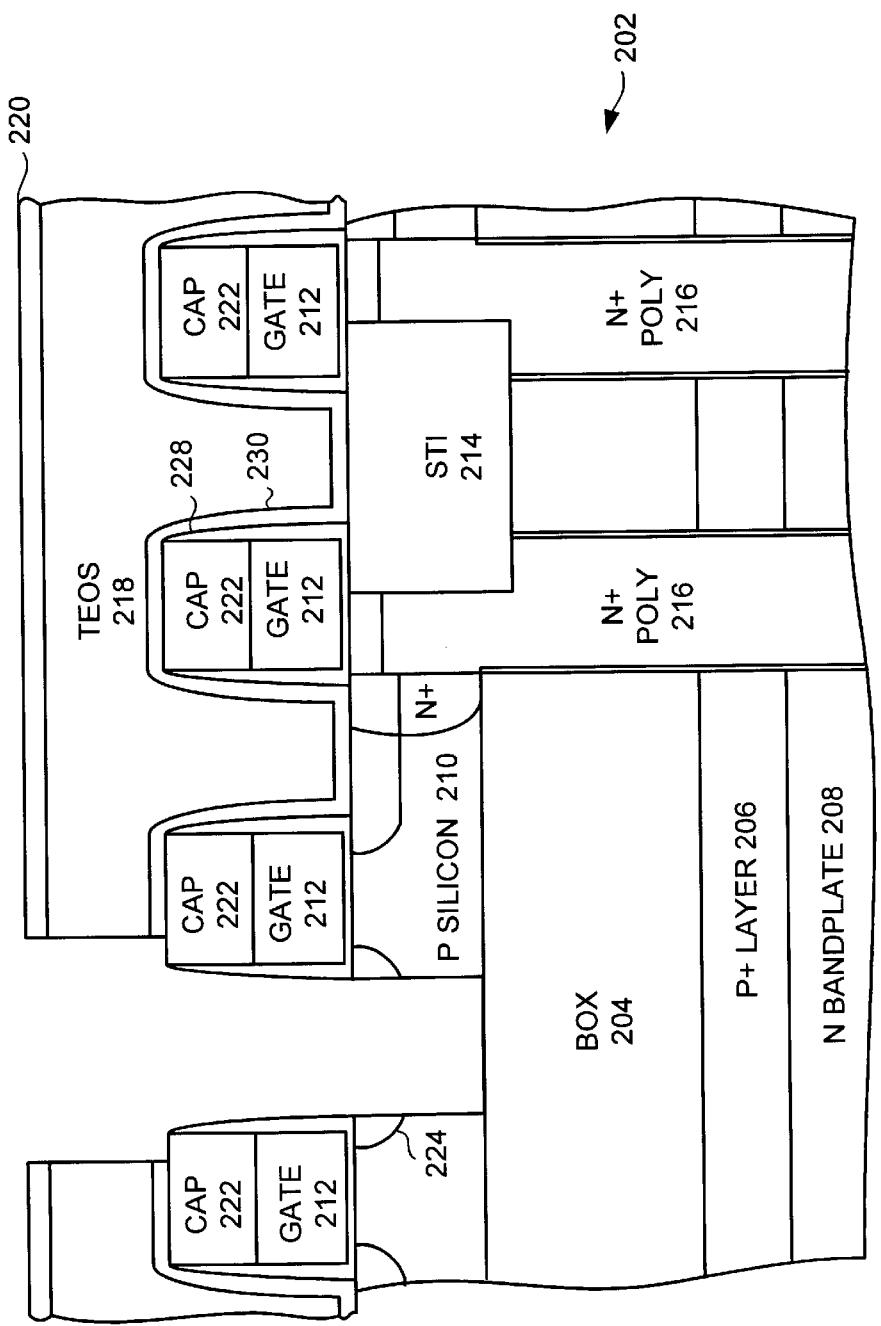

With the via opened through the TEOS layer and the various etch stop layers removed, the next step is to etch the exposed silicon substrate. This is preferably done with a reactive ion etch (RIE), using a GC poly etch that is also selective to nitride and oxide. This etch stops on the underlying insulator in the SOI wafer. Turning now to FIG. 3, the wafer 202 is illustrated after the exposed silicon substrate has been further etched, extending the via to the top of the BOX layer 204.

With the via extended to the top of the underlying insulator, the next step is to form a thin layer of silicon dioxide in the via. This is preferably done by growing a thin oxide layer, covering the exposed nitride and exposed silicon with the thin oxide layer. Preferably, the thin oxide layer has a thickness between 2 and 5 nm, although other thickness may be used where appropriate. Next, thin sidewall spacers are formed on sidewalls of the opened via. This is preferably done by conformally depositing a thin dielectric layer such as silicon nitride and then directionally etching the silicon nitride until it is removed from the horizontal surfaces. Preferably, the remaining sidewall spacers have thickness of approximately 5 nm.

Figure 4:
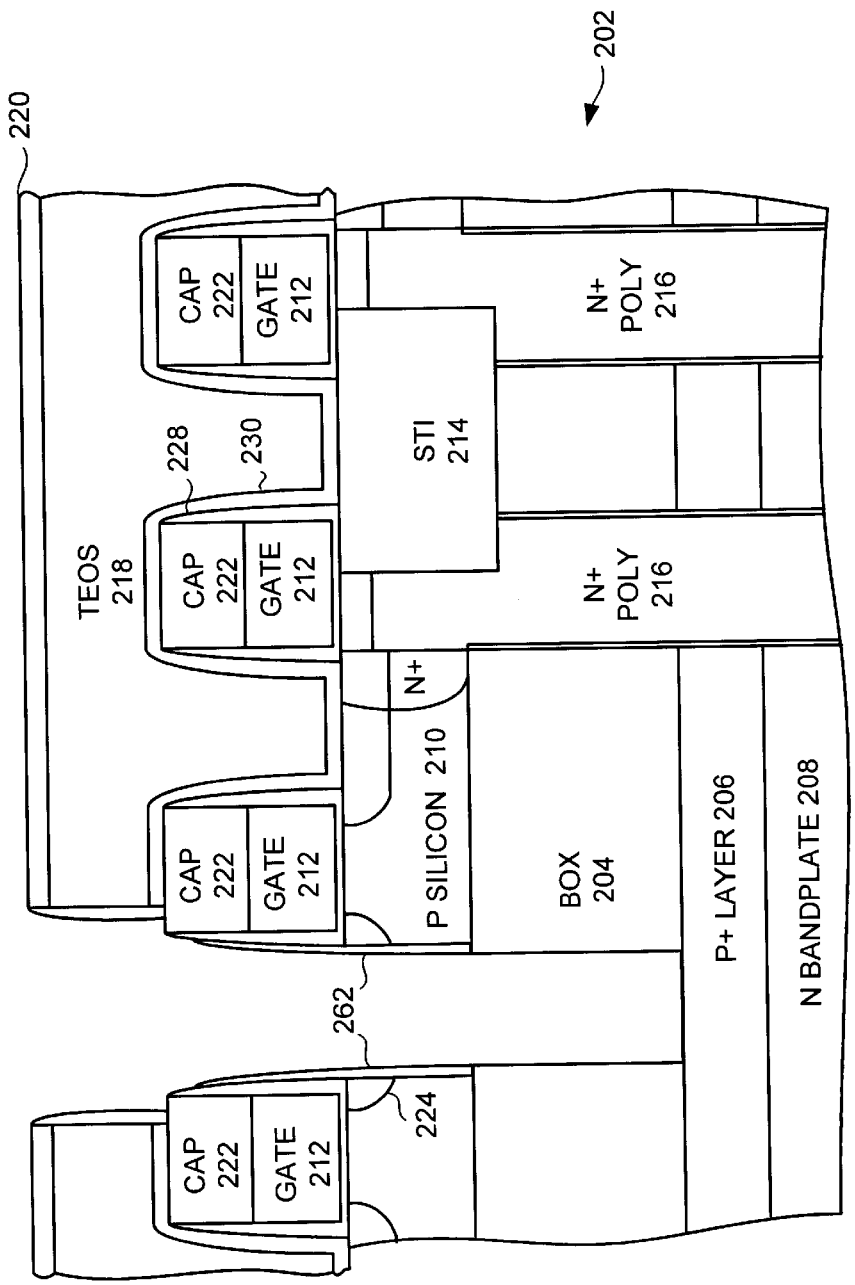

The nitride sidewall spacers then used as etch stops while the via is extended through the insulator layer and to the underlying substrate. This can be done using any suitable etch that is selective to the sidewall spacers formed in the via, but is preferably an anisotropic RIE oxide etch (with fluorine containing chemistry). Turning to FIG. 4, the wafer 202 is illustrated after a thin layer of oxide has been grown in the via, and sidewall spacers 262 formed on the sidewalls of the opened via. The sidewall spacers 262 have been used as etch masks during an etch to extend the via through BOX 204 and to the P+ layer 206.

The next step is etch out the sides of the via in the BOX insulator region. This undercuts the SOI layer, past the sidewall spacers to provide for a contact between area to the SOI. In the preferred embodiment, an HF vapor isotropic etch is used to etch the silicon dioxide that makes up the insulator layer. The HF vapor etch preferably undercuts the interface of the SOI by at least several hundred angstroms. This provides the "contact point" for the body contact part of the preferred shared via contacts.

With the via etched laterally in the insulator region, the next step is to fill the via with conductive material to form the body part of the shared via contacts. In the preferred embodiment, the via is filled with P+ doped polysilicon. This P+ doped polysilicon will serve as the "body contact" portion of the shared via contacts, and connect the SOI layer with the underlying buried P+ conductor layer. The wafer is then planarized to remove the polysilicon not in the via. The remaining polysilicon in the via is then recessed such that the top surface of the polysilicon is recessed to below the bottom of the diffusions contacting the via. This recess is preferably done using an appropriate directional etch, such as a silicon RIE. It should be noted that one advantage of the preferred embodiment process is the amount of tolerance that is afforded this silicon RIE step. In particular, while it is generally preferable that the polysilicon be recessed such that its top surface is between the bottom of the diffusions and the top of the insulator layer, it is generally acceptable if over-etch occurs such that the polysilicon is etched to below the top surface of the BOX insulator. This tolerance is a result of the horizontal contact area created between the polysilicon body contact and the SOI layer during lateral etch in the previous step. This tolerance provides increased flexibility and reliability in the fabrication process.

Alternatively, a mask may be used to selectively block the recess of the P+ polysilicon in the via. This allows the P+ polysilicon to be selectively contacted by a wiring level from above for applying a biasing voltage to the buried P+ layer, and therefore to the bodies of the SOI MOSFETs. Typically, such contact to the P+ polysilicon is made between blocks of memory arrays.

Figure 5:
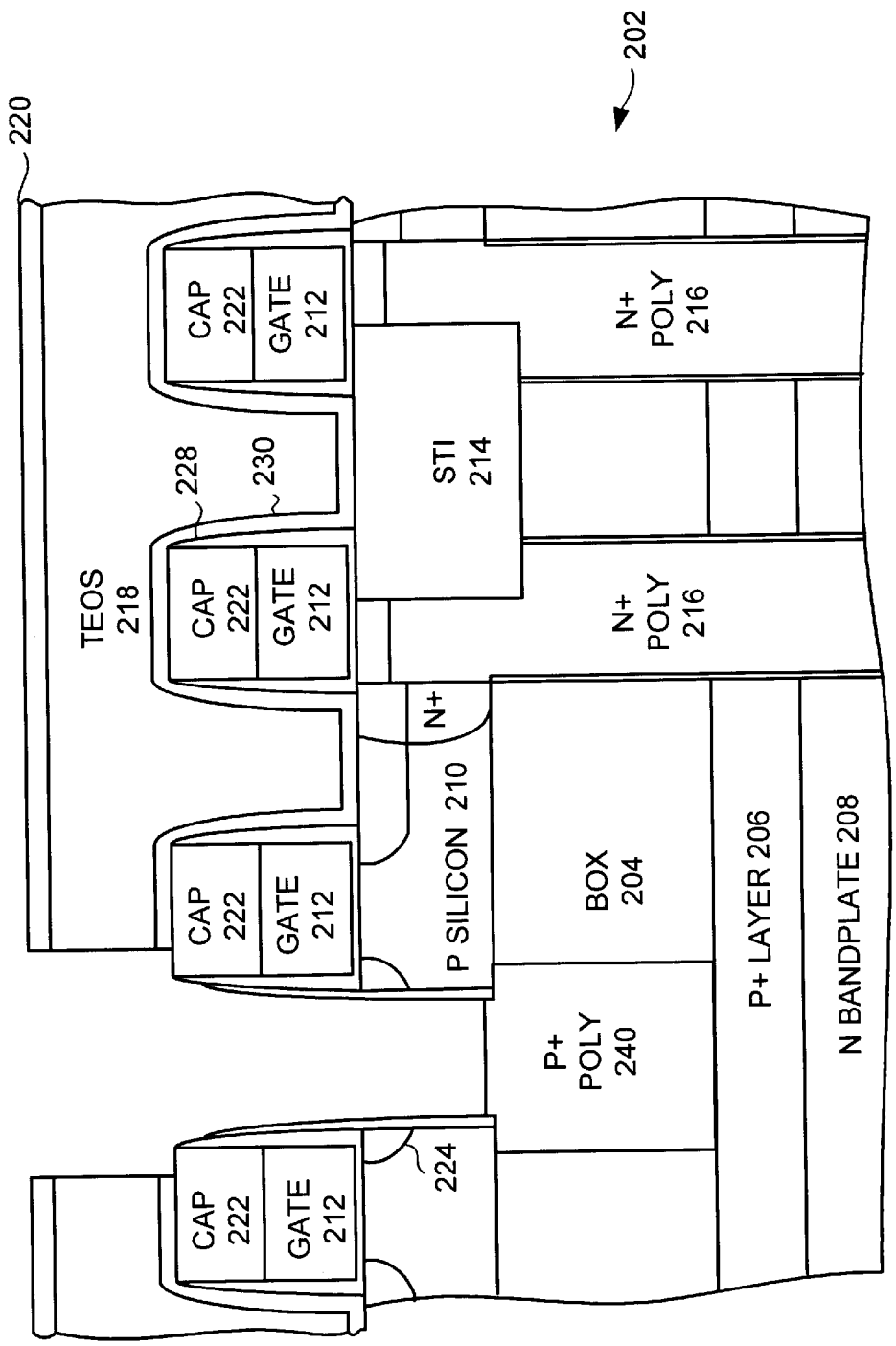

Turning now to FIG. 5, the wafer 202 is illustrated after the BOX 204 has been laterally etched by the isotropic etch, and P+ polysilicon 240 has been deposited, planarized, and recessed to below the bottom of the diffusions 224. The P+ polysilicon 240 functions as the "body contact" portion of the shared via contacts, and connect the SOI layer with the underlying buried P+ layer. Again, the isotropic etch that widened the via in the BOX 204 regions has created horizontal surfaces between the P+ polysilicon and the P silicon SOI layer 210. This provides a sure contact between the P+ polysilicon "body contact" and the P silicon SOI layer 210, even if an overetch in the previous step lowered the exposed top surface of the P+ polysilicon 240 below the top surface of the BOX. It should be noted that the in the illustration the amount of undercut has been exaggerated for clarity.

The next step is to remove the previous formed thin nitride spacers. This is preferably done using a chemical downstream etch (CDE) that is selective to the thin oxide layer underlying the thin nitride spacers. The thin oxide is then removed selective to the underlying nitride spacers, preferably using an appropriate HF vapor etch. This leaves only the original sidewall spacers formed on the sidewalls of the gate stack, while removing the material from the sidewalls of the SOI layer.

The next step is to form an insulator layer on top of the body contact. This insulator layer serves to isolate the body contact portion of the shared via contacts from the diffusion contact portion. In the preferred embodiment, the insulator layer comprises a layer of high density plasma (HDP) TEOS. HDP TEOS is directional, and thus deposits primarily on exposed horizontal surfaces. The small amount of HDP TEOS deposited on the vertical surfaces is then removed using an appropriate isotropic etch, such as an HF vapor etch.

The amount of HDP TEOS deposited is preferably selected to be sufficient to properly insulate between the body contact and the diffusion contact, but not so great as to interfere with the contact at the via sidewalls between the diffusion contact and the device diffusions.

The remaining via is the filled with conductive material, which forms the "diffusion contact" portion of the shared via contacts. In the preferred embodiment, the conductive material for the diffusion contact comprises N+ doped polysilicon. This N+ polysilicon is deposited to fill the remaining via, and the excess is planarized off. N+ polysilicon can then be connected to additional wiring structures, and thus provides a contact between the device diffusions and the above wiring.

Figure 6:
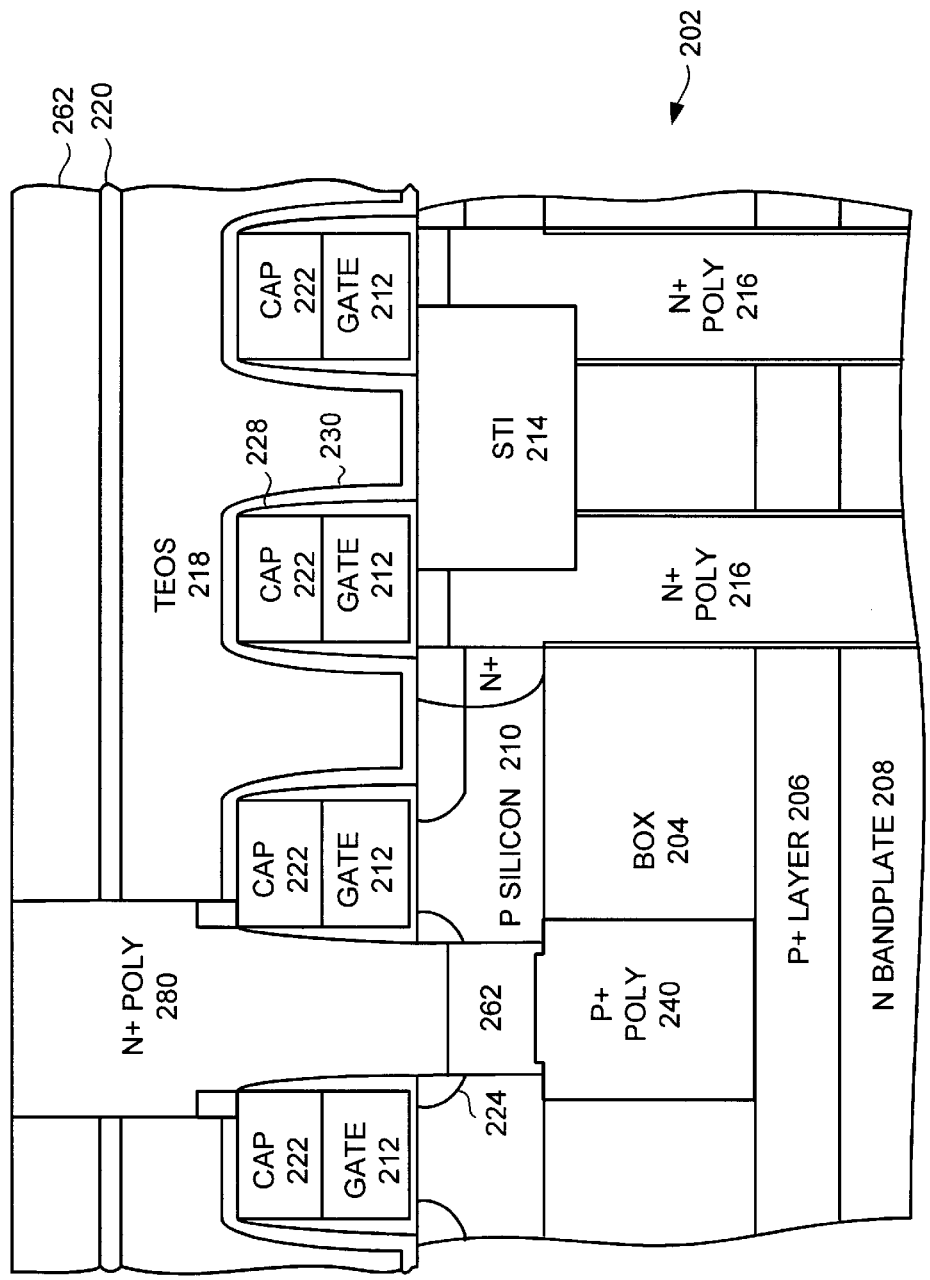

Turning now to FIG. 6, the wafer portion 202 is illustrated after the thin nitride spacers and the thin oxide layer have been removed, the HDP TEOS layer 262 has been formed above the body contact, the via sidewalls cleaned, and N+ polysilicon 280 deposited and planarized to form the diffusion contact portion of the shared via contacts. Again, the N+ polysilicon 280 provides a contact between the diffusion 224 and the above wiring levels, while the P+ polysilicon 240 provides a contact between the SOI P silicon layer 210 and the P+ layer 206.

Thus, the preferred embodiment provides a body contact and diffusion contact formed in a single shared via for silicon on insulator (SOI) technologies. By forming the body contact and diffusion contact in a single shared via, device size is minimized and performance is improved. By providing the body contact and diffusion contact together in a single shared via, the preferred embodiment avoids the area penalty that would result from separate contacts.

Turning now to FIGS. 7–11, a second embodiment is illustrated on wafer 202. Like the first embodiment, the second embodiment is illustrated for use in DRAM memory devices. Of course, the shared via contacts of the second embodiment are also not limited to DRAM devices and can thus be applied to other devices Those skilled in the art will recognize that many of the steps described below are specific to the DRAM example, and that the preferred embodiment shared via contacts can be applied to other devices without the use of those DRAM specific steps. The initial steps of this process are the same as the first embodiment. Namely, a silicon on insulator wafer is provided, that includes a buried insulator layer under an SOI layer. The deep trench capacitors are then formed, including polysilicon storage nodes and buried plate counter electrodes. A buried bandplate is then formed to connect the various counter electrodes. Shallow trench isolation regions are then formed to isolate the various devices. The gate stack material is then deposited and patterned to form a plurality of gate stacks. Sidewall spacers are then formed on the sidewalls of the gate stacks. Device diffusions are then implanted into the substrate. An etch block liner of silicon dioxide and silicon nitride is then deposited, covering the gate stacks and diffusions. A layer of TEOS or other suitable dielectric is then deposited and its top surface planarized.

Like the first embodiment, the first step in forming the shared via contacts is to open a via in the TEOS layer. This is preferably done by depositing a mask layer, patterning the mask layer, and then using the patterned mask to open a via in the TEOS layer, using the patterned silicon nitride, the nitride gate caps, and the nitride portion of the etch stop liner as a hard mask.

With the via opened through the TEOS layer, the exposed nitride portion of the etch stop liner is removed using the oxide portion as an etch stop. Then the exposed oxide portion is removed, exposing the nitride sidewall spacers the surface of the SOI layer. The next step in the second embodiment is to etch the exposed SOI layer. This is preferably done with a reactive ion etch (RIE), using a GC poly etch that is also selective to nitride and oxide. This etch stops on the underlying insulator in the SOI wafer.

Figure 7:
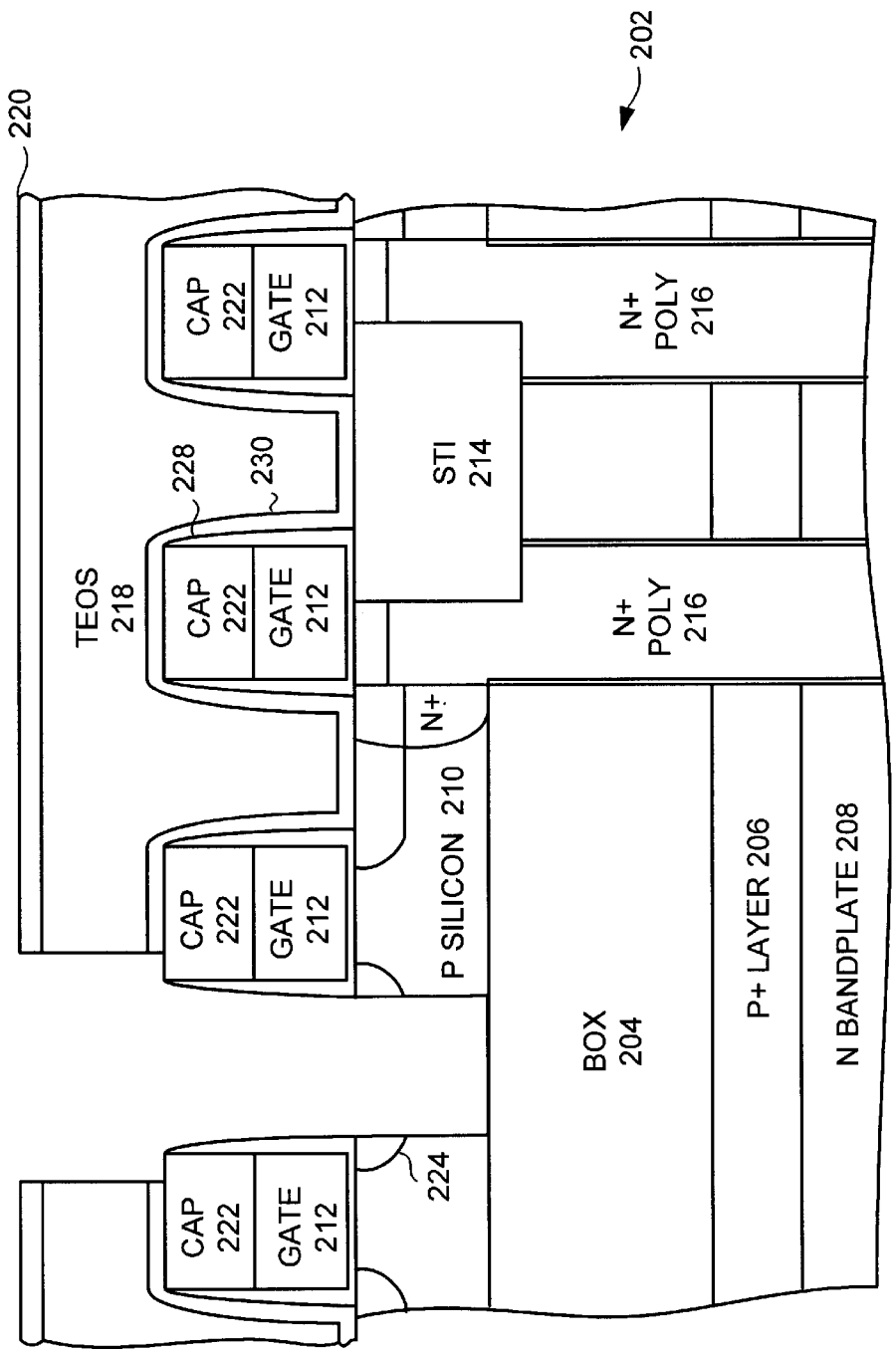
FIGS. 7–11 are cross-sectional views of semiconductor in the process of forming shared via contacts in accordance with a second embodiment.

Turning now to FIG. 7, the wafer 202 is illustrated after initial formation of the devices, the deposition of TEOS 218, the deposition and patterning of silicon nitride layer 220, and the opening of a via in TEOS 218 using the nitride layer 220, the caps 222 and nitride portion of the etch stop liner 228 are used as a hard mask. The exposed nitride portion of the etch stop liner 228 was then removed, followed by the removal of the exposed oxide portion, exposing SOI layer 210. The SOI 210 has then been further etched, extending the via to the top of the BOX layer 204. Again, the processing to this point is preferably the same as that in the first embodiment.

Figure 8:
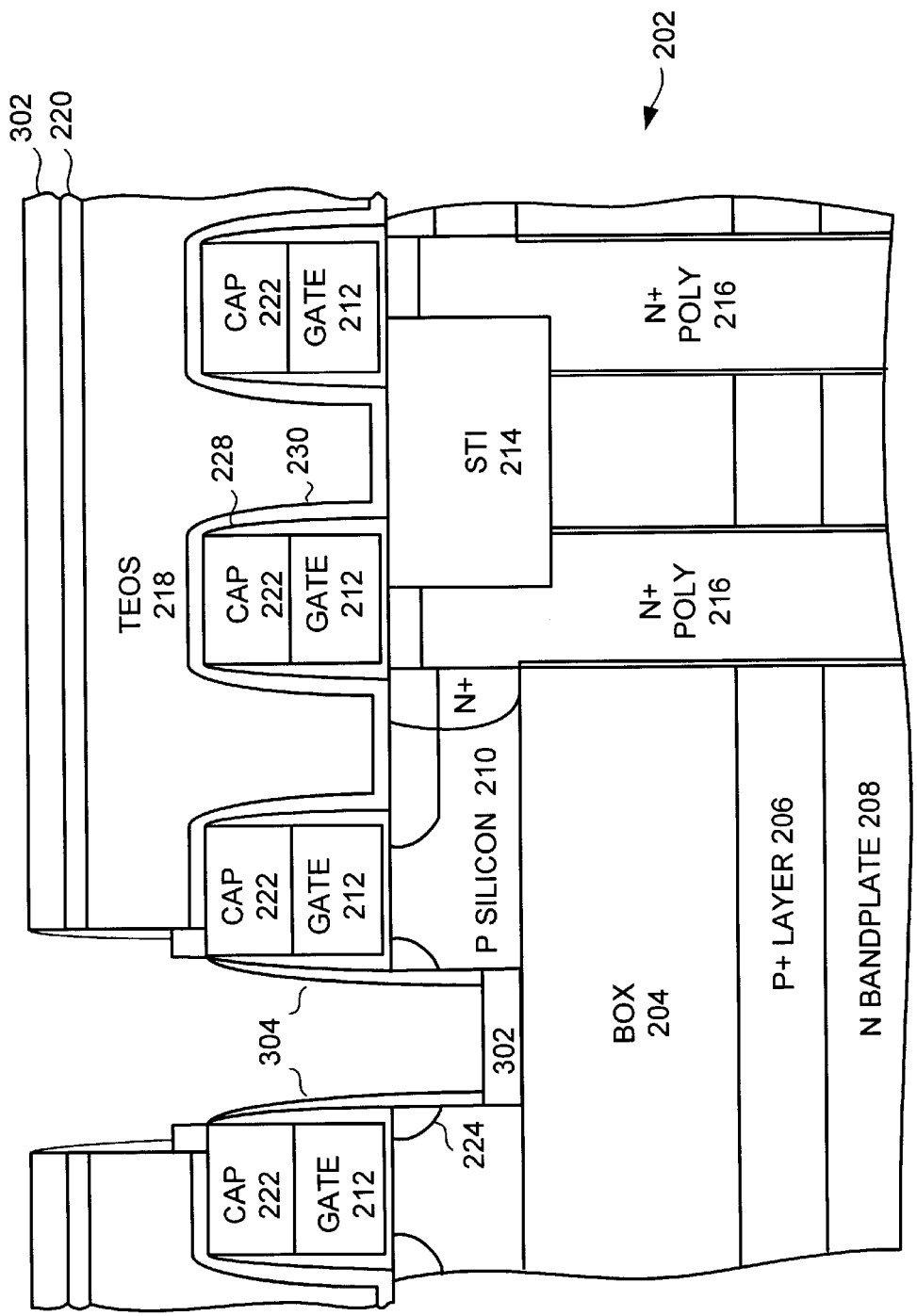

The next step in the second embodiment is to deposit an insulator layer. In the preferred second embodiment, the insulator layer comprises a layer of high density plasma TEOS that deposits primarily on the horizontal surfaces. As such, the layer is deposited extensively at the bottom of the via, but only slightly on the sidewalls of the via. Thin sidewall spacers are then formed on the sidewalls of the via. In the preferred second embodiment, the thin sidewall spacers comprises approximately 5 nm of silicon nitride spacers that are formed by conventional deposition and directional etch. These sidewall spacers protect the sides of the SOI layer on the sidewalls of the via. Turning now to FIG. 8, the wafer 202 is illustrated after the deposition of HDP TEOS 302 and the formation of thin nitride spacers 304 on the sidewalls of the via.

Figure 9:
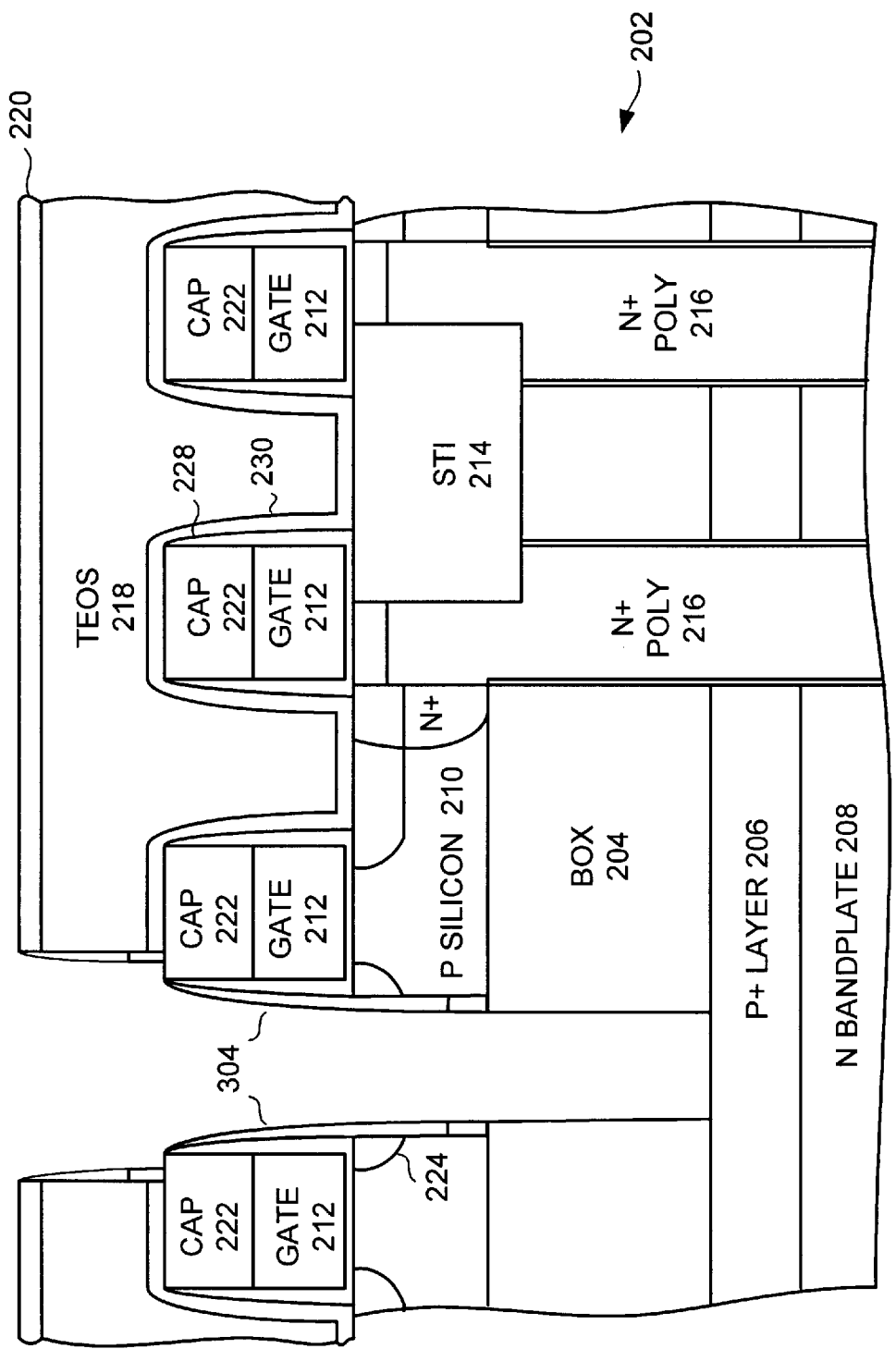

The next step is to perform a directional etch selective to the sidewall spacer material. In the preferred second embodiment, the directional etch is a RIE that etches through the TEOS layer and through the BOX layer to the underlying substrate. Turning now to FIG. 9, the wafer portion 202 is illustrated after a directional etch has been used to etch through TEOS layer 302 and BOX 204. Again, because the preferred etch is selective to nitride, the etch does not effect the sidewalls of the via where they are protected by sidewall spacers 304. Additionally, the etch removes TEOS 302 from over nitride layer 220 and stops at nitride layer 220 on the top surface. Additionally, the preferred etch is selective to silicon such that it stops at P+ layer 206.

The next step is to perform an isotropic etch to remove the remaining portions of insulator layer under the sidewall spacer. In the preferred second embodiment, an HF acid vapor etch is used that removes the remaining HDP TEOS under the thin nitride spacers. Since HDP TEOS etches much faster than oxide, the sidewalls of the BOX layer remain essentially undisturbed. Therefore, no significant undercutting of the back of the SOI layer occurs.

With the remaining insulator material removed, conductive material is deposited into the via to form the body contact portion of the shared via contacts. In the preferred embodiment, P+ polysilicon is deposited, and planarized and recessed. This P+ doped polysilicon will serve as the "body contact" portion of the shared via contacts, and connect the SOI layer with the underlying buried P+ layer.

The P+ polysilicon is preferably recessed such that such that the top surface of the polysilicon is recessed to below the bottom of the diffusions contacting the via. This recess is preferably done using an appropriate directional etch, such as an RIE. In the preferred embodiment, the P+ polysilicon is recessed such that it does not touch depletion region from diffusions 224, yet shallow enough to assure contact to P silicon 210. The recess typically ranges from 100 nm to 300 nm, depending on depth of diffusion 224 and thickness of SOI layer 210.

With the body contact material recessed, the next step is to deposit a second insulator layer on top of the body contact material. This second insulator layer serves as an intermediate insulator layer to isolate the body contact portion of the shared via contacts from the diffusion contact portion. In the preferred embodiment, the second insulator layer comprises a layer of high density plasma (HDP) TEOS. HDP TEOS is directional, and thus deposits primiarly on exposed horizontal surfaces. The small amount of HDP TEOS deposited on the vertical surfaces is then removed using an appropriate isotropic etch, such as an HF vapor etch.

The amount of HDP TEOS deposited is preferably selected to be sufficient to properly insulate between the body contact and the diffusion contact, but not so great as to interfere with the contact at the via sidewalls between the diffusion contact and the device diffusions.

Figure 10:
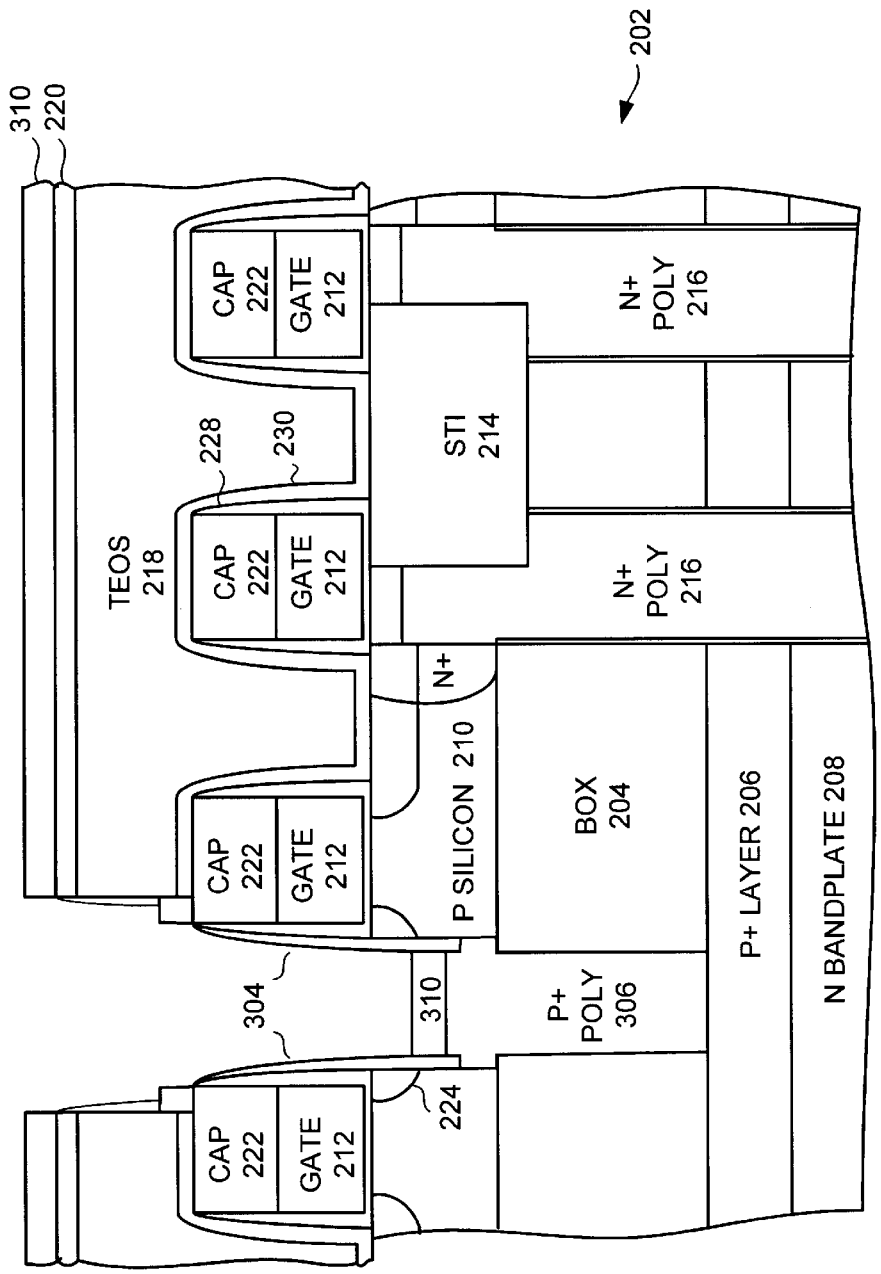

Turning now to FIG. 10, the wafer 202 is illustrated after the remaining HDP TEOS 302 has been removed from the sidewalls of P silicon 210 by the HF acid vapor etch, the P+ polysilicon 306 has been deposited, planarized, and recessed to below the bottom of the diffusions 224, and a second TEOS layer 310 has been deposited. The P+ polysilicon 240 functions as the "body contact" portion of the shared via contacts, and connect the SOI layer 210 with the underlying P+ layer 206. The second TEOS layer 310 serves to insulate the body contact portion of the shared via contacts from the diffusion contact, to be formed later.

The next step is to remove the previously formed thin sidewall spacers. This is preferably done using an isotropic etch. In the preferred second embodiment, the thin nitride spacers are removed using a wet or CDE etch. This etch removes the nitride to expose the sidewalls of the diffusion region to facilitate contact to these regions.

The remaining via is then filled with conductive material, which forms the "diffusion contact" portion of the shared via contacts. In the preferred embodiment, the conductive material for the diffusion contact comprises N+ doped polysilicon. This N+ polysilicon is deposited to fill the remaining via, and the excess is planarized off. N+ polysilicon can then be connected to additional wiring structures, and thus provides a contact between the device diffusions and the above wiring.

Figure 11:
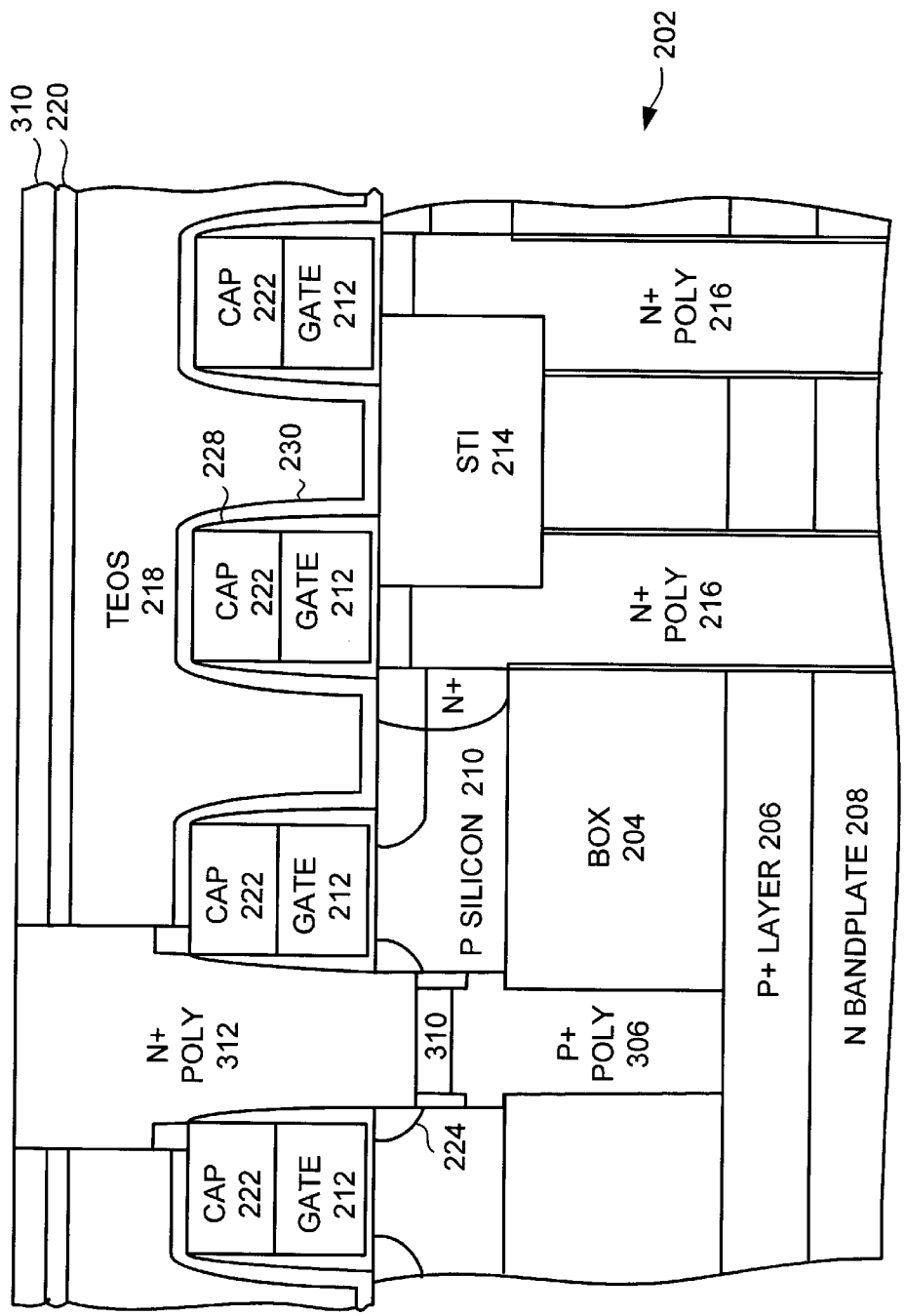

Turning now to FIG. 11, the wafer portion 202 is illustrated after the thin nitride spacers 304 have been removed, and N+ polysilicon 312 deposited and planarized to form the diffusion contact portion of the shared via contacts. Again, the N+ polysilicon 312 provides a contact between the diffusions 224 and the above wiring levels, while the P+ polysilicon 306 provides a contact between the SOI P silicon layer 210 and the P+ layer 206.

Thus, the present invention overcomes the difficulties found in the background art by providing a body contact and diffusion contact formed in a single shared via for silicon on insulator (SOI) technologies. By forming the body contact and diffusion contact in a single shared via, device size is minimized and performance is improved. Particularly, the formed body contact connects the SOI layer with the underlying substrate to avoid instabilities and leakage resulting from floating SOI channel regions. The formed diffusion contact connects device diffusions to above wiring to facilitate device operation. By providing the body contact and diffusion contact together in a single shared via, the preferred embodiment avoids the area penalty that would result from separate contacts. Additionally, the preferred embodiment provides a body contact that is self aligned with other devices, minimizing tolerances needed while minimizing process complexity.

While the invention has been described in terms of two embodiments, one skilled in the art will realize that variation may be made to the embodiments described above without departing from the invention. For example, various multi-layer composite insulating materials may be used for gate sidewall insulators 228. Use of alternative insulating layers for gate sidewall spacers 228 may allow for improved robustness and process compatibility depending upon the etch processes used within the via.

What is claimed is:

1. An apparatus comprising:
    a) a silicon on insulator (SOI) substrate, the SOI substrate including a SOI layer, a buried insulator layer beneath the SOI layer, a buried conductor layer beneath the buried insulator layer, and at least one device diffusion in the SOI layer;
    b) a via in the silicon on insulator substrate, the via extending through the buried insulator layer to the buried conductor layer, the via having a bottom portion and a top portion;
    c) a body contact in the bottom portion of the via, the body contact providing contact between the buried conductor layer and the SOI layer;
    d) a contact insulator in the via above the body contact; and
    e) a diffusion contact in the top portion of the via, the diffusion contact connecting the device diffusion to device wiring above, the diffusion contact insulated from the body contact by the contact insulator.

2. The apparatus of claim 1 wherein the lower portion of the via is laterally wider where the via extends through the buried insulator layer.

3. The apparatus of claim 1 wherein the body contact comprises P+ polysilicon recessed until the top surface of the P+ polysilicon is below the device diffusion.

4. The apparatus of claim 1 wherein the diffusion contact comprises planarized N+ polysilicon on the contact insulator.

5. The apparatus of claim 1 wherein the body contact and diffusion contact are formed borderless to an adjacent gate conductor.

6. An apparatus comprising:
    a) a silicon on insulator (SOI) substrate, the SOI substrate including a SOI layer, a buried insulator layer beneath the SOI layer, and a buried conductor layer beneath the buried insulator layer;
    b) a gate stack on said substrate, said gate stack including gate conductor and a gate cap;
    c) sidewall spacers on sidewalls of said gate stack;
    d) a device diffusion adjacent said gate stack;
    e) a etch stop liner on the gate cap and the sidewall spacers;

f) a wiring insulator layer on the etch stop liner;

g) a via, the via extending through the wiring insulator layer, SOI layer and buried insulator layer;

h) a body contact in the via, the body contact providing contact between the buried conductor layer and the SOI layer;

i) a contact insulator in the via above the body contact; and j) a diffusion contact in the via, the diffusion contact connecting the device diffusion to device wiring above, the diffusion contact insulated from the body contact by the contact insulator.

7. The apparatus of claim 6 wherein the lower portion of the via is laterally wider where the via extends through the buried insulator layer.

8. The apparatus of claim 6 wherein the diffusion contact comprises planarized N+ polysilicon on the contact insulator.

9. The apparatus of claim 6 wherein the body contact comprises P+ polysilicon recessed until the top surface of the P+ polysilicon is below the device diffusion.

10. The apparatus of claim wherein the body contact and diffusion contact are formed borderless to the gate conductor.

* * * * *